United States Patent
Zhang

(10) Patent No.: US 9,536,889 B2
(45) Date of Patent: Jan. 3, 2017

(54) SPLIT GATE MEMORY DEVICE, SEMICONDUCTOR DEVICE AND FORMING METHOD THEREOF

(71) Applicant: Shanghai Huahong Grace Semiconductor Manufacturing Corporation, Shanghai (CN)

(72) Inventor: Lingyue Zhang, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 14/584,931

(22) Filed: Dec. 29, 2014

(65) Prior Publication Data
US 2016/0027792 A1    Jan. 28, 2016

(30) Foreign Application Priority Data
Jul. 24, 2014  (CN) .......................... 2014 1 0356810

(51) Int. Cl.
*H01L 27/115* (2006.01)
*H01L 29/66* (2006.01)
(Continued)

(52) U.S. Cl.
CPC ... *H01L 27/11521* (2013.01); *H01L 21/02271* (2013.01); *H01L 21/26513* (2013.01);
(Continued)

(58) Field of Classification Search
CPC ............ H01L 27/11521; H01L 29/7881; H01L 27/11534; H01L 21/31144; H01L 21/28525; H01L 21/26513; H01L 29/66825; H01L 21/32139; H01L 29/42364; H01L 29/42328; H01L 21/02271; H01L 21/28273; H01L 29/66
See application file for complete search history.

(56) References Cited

U.S. PATENT DOCUMENTS 5,386,132 A    1/1995  Wong
6,737,700 B1 *  5/2004 Chang ................... H01L 27/115
                                                      257/315
(Continued)

FOREIGN PATENT DOCUMENTS

CN        102117814 A     7/2011
CN        103165615 A     6/2013
(Continued)

OTHER PUBLICATIONS

First Chinese Office Action regarding Application No. 201410356810.0 dated Apr. 29, 2016. English translation provided by Unitalen Attorneys at Law.

*Primary Examiner* — John P Dulka
*Assistant Examiner* — Charles R Peters
(74) *Attorney, Agent, or Firm* — Harness, Dickey & Pierce, P.L.C.

(57) ABSTRACT

A split gate memory device, a semiconductor device and a manufacturing method thereof are provided. In the split gate memory device, an erasing gate is further disposed, wherein the easing gate and a control gate are respectively disposed on two sides of a floating gate. Thus, an erase operation is implemented by the erasing gate instead of the control gate. Accordingly, electric potential applied to the control gate is reduced. Therefore, hot-electron effect in channel region may be avoided, and performance degradation of the memory caused by the hot-electron effect may be avoided as well. Furthermore, as electric potential applied to the control gate is reduced, a gate oxide layer underneath the control gate may be thinner. Accordingly, manufacturing processes of the control gate and the gate oxide layer and that of the gate and the gate oxide layer of a logic transistor in a periphery circuit may be compatible.

11 Claims, 6 Drawing Sheets

(51) Int. Cl.
  *H01L 29/423* (2006.01)
  *H01L 21/28* (2006.01)
  *H01L 21/285* (2006.01)
  *H01L 21/3213* (2006.01)
  *H01L 21/311* (2006.01)
  *H01L 21/265* (2006.01)
  *H01L 21/02* (2006.01)
  *H01L 29/788* (2006.01)

(52) U.S. Cl.
  CPC .. *H01L 21/28273* (2013.01); *H01L 21/28525* (2013.01); *H01L 21/31144* (2013.01); *H01L 21/32139* (2013.01); *H01L 27/11534* (2013.01); *H01L 29/42328* (2013.01); *H01L 29/42364* (2013.01); *H01L 29/6656* (2013.01); *H01L 29/66825* (2013.01); *H01L 29/7881* (2013.01)

(56) References Cited

U.S. PATENT DOCUMENTS

| | | | |
|---|---|---|---|
| 8,669,607 | B1 | 3/2014 | Tsair et al. |
| 8,890,232 | B2 | 11/2014 | Tsair et al. |
| 2004/0087084 | A1 | 5/2004 | Hsieh |
| 2010/0127308 | A1* | 5/2010 | Do ............... H01L 21/28273 257/204 |
| 2014/0151782 | A1 | 6/2014 | Tsair et al. |
| 2015/0179749 | A1* | 6/2015 | Chen ............... G11C 16/10 365/185.18 |

FOREIGN PATENT DOCUMENTS

| | | |
|---|---|---|
| CN | 103258797 A | 8/2013 |
| CN | 103811496 A | 5/2014 |
| JP | 2000286348 A | 10/2000 |
| JP | 2001085543 A | 3/2001 |

* cited by examiner

SPLIT GATE MEMORY DEVICE, SEMICONDUCTOR DEVICE AND FORMING METHOD THEREOF

CROSS-REFERENCE TO RELATED APPLICATIONS

The present application claims priority to Chinese patent application No. 201410356810.0, filed on Jul. 24, 2014, and entitled "SPLIT GATE MEMORY DEVICE, SEMICONDUCTOR DEVICE AND FORMING METHOD THEREOF", the entire disclosure of which is incorporated herein by reference.

TECHNICAL FIELD

The present disclosure generally relates to semiconductor fabrication, and more particularly, to a split gate memory device, a semiconductor device, and a method for forming a semiconductor device.

BACKGROUND

Random memory devices, such as DRAM (Dynamic Random Access Memory) and SRAM (Static Random Access Memory) devices, may lose data stored therein when losing power. Accordingly, various NVM (Nonvolatile Memory) devices have been designed for solving the above mentioned deficiencies of random memory devices. Nowadays, flash memory devices, which are designed based on floating gate, have become the most commonly used NVM devices, because they normally have small cell dimensions and good working performance.

There are basically two major types of NVM devices, stack gate type and split gate type. A stack gate memory device normally includes a tunneling oxide layer formed on a substrate. A floating gate polycrystalline silicon layer is formed on the tunneling oxide layer for storing electrons. A multi-layer stack structure consisting of oxide, nitride and oxide is formed on the floating gate. And a control gate polycrystalline silicon layer is disposed on the multi-layer stack structure, which is adapted to controlling storages and releases of electrons.

Referring to FIG. 1, a split gate memory device is illustrated, which also includes a tunneling oxide layer 11, a floating gate polycrystalline silicon layer 12 for storing electrons, an ONO (oxide-nitride-oxide) stack layer 13, and a control gate polycrystalline silicon layer 14. However, compared with the stack gate memory device, the control gate polycrystalline silicon layer 14 of the split gate memory device is divided into two parts, a first part 141 and a second part 142 as illustrated in FIG. 1. The first part 141 partially covers the floating gate polycrystalline silicon layer 12 and the upper sidewall of the ONO stack layer 13. The second part 142 is located beside the lower sidewall of the stack layer 13. Further, the tunneling oxide layer 11 is located between the control gate polycrystalline silicon layer 14 and the floating gate polycrystalline silicon layer 12. The split gate NVM device further includes a substrate 10, a first oxide layer 15 located between the substrate 10 and the control gate polycrystalline silicon layer 14, and a second oxide layer 16 located between the substrate 10 and the float gate polycrystalline silicon layer 12. The first oxide layer 15 is used for isolating the substrate 10 from the control gate polycrystalline silicon layer 14, and the second oxide layer 16 is used for isolating the substrate 10 from the floating gate polycrystalline silicon layer 12. Compared with stack gate memory devices, split gate memory devices may not have technical drawbacks like excessive writing/erasing.

When writing data into and/or erasing data out from the split gate memory device, a source region and a drain region which have higher electric potentials than a power source electric potential Vcc are used for forming a hot carrier path. Thereafter, electrode carriers can pass through the oxide layer isolating the floating gate from the source region and the drain region. As a result, the electrode carriers may be implanted into the floating gate or be extracted from the floating gate.

However, in practice, the split gate flash memory devices as recited above have some disadvantages. For example, in order to implement an erase operation, a voltage applied is normally larger than 7 V (e.g. 12 V), thus hot electron effect may occur in the channel region. Therefore, after being used for some time, the split gate flash memory devices may have decreased reliabilities, i.e., performance degradation.

In addition, a periphery circuit may be configured to cooperate with the split gate flash memory device to implement some functionality. The periphery circuit is normally a logic circuit which may include logic transistors. If the split gate flash memory device and the transistors are respectively fabricated on different integrated chips, running speed of the entire memory device may be limited by a signal transmission bandwidth between the flash memory device and the periphery circuit. Accordingly, integrated semiconductor device which embeds the logic transistors into the split gate flash memory device is invented.

Referring still to FIG. 1, in the erase operation, a high voltage is applied to the control gate 14. Meanwhile, if the oxide layer 15 does not have an adequate thickness, electrodes in the substrate 10 may be dragged into the control gate 14. Therefore, the gate oxide layer 15 underneath the control gate 14 (specifically, the second part 142 of the control gate 14) is required to have a larger thickness. However, a gate oxide layer of the logic transistor in the periphery circuit is normally not so thick. As a result, when manufacturing the integrated semiconductor device recited above, integration of forming the split gate flash memory device with the thicker oxide layer 15 and forming the logic transistor with the thinner oxide layer is not easy to achieved.

Therefore, there is a need for a new split gate memory device, a new semiconductor device and a manufacturing method thereof.

SUMMARY

According to one embodiment of the present disclosure, a split gate memory device is provided, including:

a semiconductor substrate having a source region, a drain region, and a channel region located between the source region and the drain region;

a first gate oxide layer located on a first portion of the source region and a first portion of the channel region;

a floating gate located on the first gate oxide layer;

a second gate oxide layer located on a second portion of the source region and a second portion of the channel region;

a control gate located on the second gate oxide layer;

an insulating layer isolating the first gate oxide layer and the floating gate away from the second gate oxide layer and the control gate;

an insulating oxide layer located on the source region;

an erasing gate located on the insulating oxide layer; and a tunnel insulating layer located between the erasing gate and the floating gate.

Optionally, the split gate memory device is connected with another split gate memory device which has the same structure as the split gate memory device stated above, components of the two split gate memory devices are in mirror symmetry, and two erasing gates thereof are connected.

Optionally, the second gate oxide layer has a thickness ranging from 1 nm to 10 nm.

Optionally, the split gate memory device further includes a conductive plug which is coupled to the source region, wherein the conductive plug is used for applying a voltage to the source region.

Optionally, the insulating layer has a thickness ranging from 20 nm to 100 nm.

According to one embodiment of the present disclosure, a semiconductor device is also provided, including: a storage unit region and a periphery circuit region, wherein the periphery circuit region includes a logic transistor, and the storage unit region includes any one of the split gate memory devices recited above.

According to one embodiment of the present disclosure, a method for manufacturing a semiconductor device is also provided, including:

providing a semiconductor substrate which at least includes a storage unit region and a periphery circuit region;

forming a first oxide layer on the semiconductor substrate;

forming a first polycrystalline silicon layer on the first oxide layer;

forming a hard mask layer on the first polycrystalline silicon layer, wherein the hard mask layer has a first groove which is located on the storage unit region;

forming a first spacer on a sidewall of the first groove;

etching, by using the first spacer as a mask, the first polycrystalline silicon layer and the first oxide layer until a thickness of the first oxide layer is at least partially reduced, so as to form a second groove;

injecting ions into a portion of the substrate which is located underneath the second groove, so as to form a source region of a storage transistor;

forming a second oxide layer on a bottom and a sidewall of the second groove;

forming a second polycrystalline silicon layer on the second oxide layer to completely fill up the second groove, wherein the second polycrystalline silicon layer in the second groove constitutes an erasing gate, a portion of the second oxide layer which is located on the sidewall of the second groove constitutes a tunnel insulating layer, and a portion of the second oxide layer which is located between the erasing gate and the semiconductor substrate constitutes an insulation oxide layer;

removing the remained hard mask layer, a portion of the first polycrystalline silicon layer and a portion of the first oxide layer which are disposed under the remained hard mask layer, by a photolithography process and an etching process, so as to expose sidewalls of the first spacer, the remained first polycrystalline silicon layer and the remained first oxide layer, and expose the semiconductor substrate, where the remained first polycrystalline silicon layer located under the first spacer constitutes a floating gate, and the remained first oxide layer constitutes a first gate oxide layer;

forming a second spacer on the exposed sidewalls of the first spacer, the remained first polycrystalline silicon layer and the remained first oxide layer;

forming a third oxide layer on the exposed surface of the semiconductor substrate, and forming a third polycrystalline silicon layer on the third oxide layer;

implementing the photolithography process and the etching process to the third oxide layer and the third polycrystalline silicon layer, so as to form a second gate oxide layer and a control gate on the storage unit region, and to form a third gate oxide layer and a gate of a logic transistor on the periphery circuit region;

forming a third spacer on each of the exposed sidewalls of the second gate oxide layer, the control gate, the third gate oxide layer and the gate of the logic transistor, respectively; and injecting ions into the semiconductor substrate by using the third spacers as masks, so as to form a drain region of the storage transistor, a source region of the logic transistor, and a drain region of the logic transistor, respectively.

Optionally, during the formation of the second groove, if the etching process is performed by using the first spacer as a mask until the first oxide layer exposed by the first spacer is completely removed and the semiconductor substrate is exposed, only the second oxide layer disposed between the erasing gate and the semiconductor substrate constitutes the insulation oxide layer, and if the etching process is performed to only reduce the thickness of the first oxide layer, the second oxide layer together with the first oxide layer remained in the etching process constitute the insulation oxide layer.

Optionally, the method further including:

forming an interlayer dielectric layer on the drain region and part of the source region of the storage transistor, and on the source region and the drain region of the logic transistor; and forming a conductive plug which is connected with the source region of the storage transistor, in the interlayer dielectric layer formed on part of the source region of the storage transistor.

Optionally, the second spacer is formed by a chemical vapor deposition process, and has a thickness ranging from 20 nm to 100 nm.

The present disclosure has follow advantages in comparison with existed technology. The split gate structure provided in the present disclosure not only includes a floating gate and a control gate, but also is provided with an erasing gate. The erasing gate and the control gate are disposed on two sides of the floating gate. As such, the newly introduced erasing gate can control the erase operation of the memory device, which is originally took charge by the control gate. Since the erase operation requires higher voltage than writing and reading operations, and the control gate is no longer used for controlling the erase operation, the voltage applied to the controlling gate can be reduced. Therefore, hot electron effect in the channel region may be avoided, and performance degradation caused by this effect may be also avoided. Further, as the voltage applied to the control gate decreases, the gate oxide layer under the control gate can be made thinner, which is closer to the thickness of a gate oxide layer under a logic transistor gate in the periphery circuit region. Such that integration between the manufacturing processes of these component can be achieved more simply. From circuit design aspect, the memory device can be more simply integrated with a logic circuit.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

As described in the background, in an existing split gate transistor, a higher voltage is required to be applied to a control gate during an erase operation, thus hot electron effect in the channel region may occur. Therefore, reliability of the split gate transistor may be reduced due to the hot electron effect. Furthermore, since higher voltage is applied to the control gate, a first gate oxide layer under the control gate should be made thicker, meanwhile a second gate oxide layer under a logic transistor gate in the periphery circuit region is thinner. Such that integration between the manufacturing processes of the split gate flash memory device with the thicker first gate oxide layer and the logic transistor with the thinner second gate oxide layer can not be achieved simply. In order to solve above mentioned problem, a split gate memory device is provided according to one embodiment of the present disclosure, which not only includes a floating gate and a control gate, but also is provided with an erasing gate, wherein the floating gate is located between the control gate and the erasing gate. As such, the newly introduced erasing gate can control the erase operation of the memory device, which is originally took charge by the controlling gate. Since the erase operation requires higher voltage than writing and reading operations, and the controlling gate is no longer used for controlling the erase operation, the voltage applied to the controlling gate can be reduced. Therefore, hot electron effect in the channel region may be avoided, and performance degradation caused by this effect may be also avoided. Further, as the voltage applied to the controlling gate decreases, the gate oxide layer under the controlling gate can be made thinner, which is closer to the thickness of a gate oxide layer under a logic transistor gate in the periphery circuit region. Such that integration between the manufacturing processes of these component can be achieved more simply. From circuit design aspect, the memory device can be more simply integrated with a logic circuit.

Figure 1:
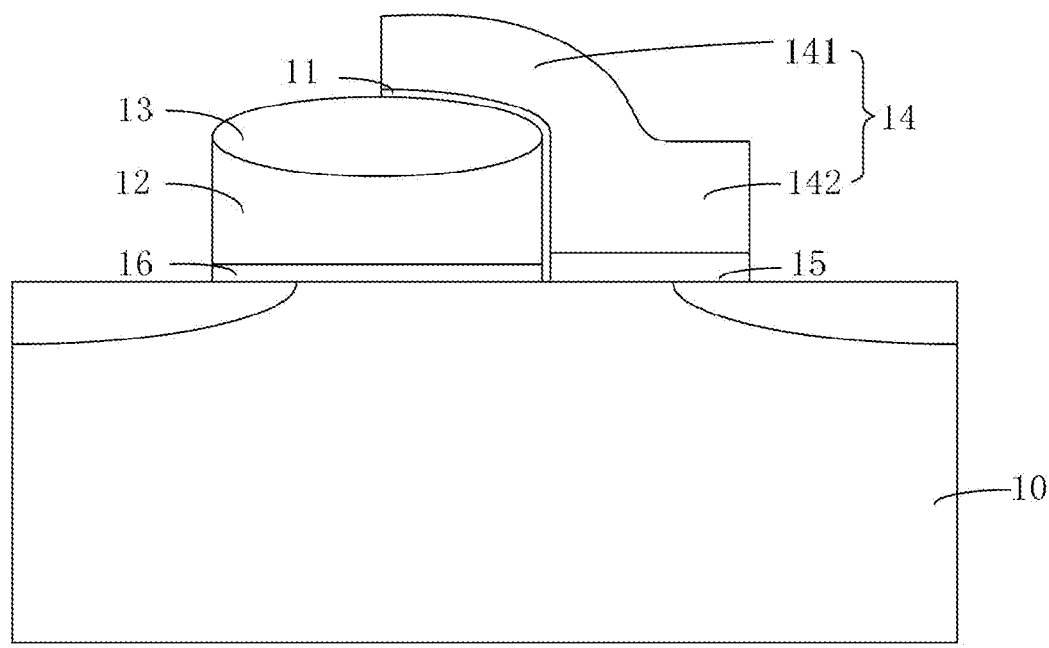
FIG. 1 schematically illustrates a cross-sectional structure of an existed split gate memory device.
Figure 2:
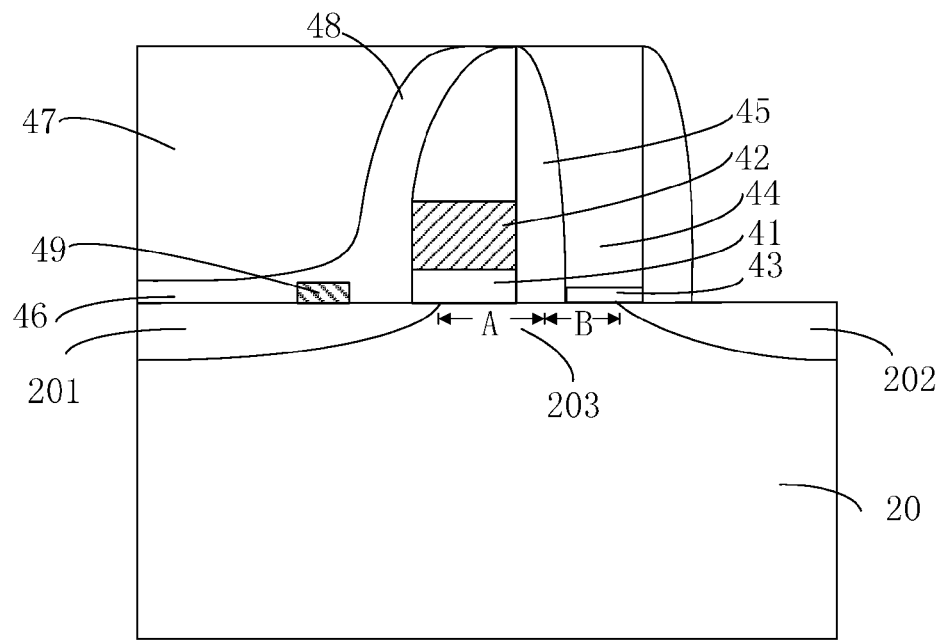
FIG. 2 schematically illustrates a cross-sectional structure of a split gate memory device according to one embodiment of the present disclosure.

Referring to FIG. 2, a split gate memory device according to one embodiment of the present disclosure is illustrated, including:

a semiconductor substrate 20 forming a source region 201, a drain region 202 and a channel region 203 between the source region 201 and the drain region 202;

a first gate oxide layer 41 located on a first portion of the source region 201 and a first portion of the channel region 203;

a floating gate 42 located on the first gate oxide 41;

a second gate oxide layer 43 located on a second portion of the channel region 203 and a second portion of the drain region 202;

a control gate 44 located on the second gate oxide layer 43;

an insulating layer 45 which is located between a sidewall formed by the first gate oxide layer 41 and the floating gate 42 and a sidewall formed by the second gate oxide layer 43 and the control gate 44;

an insulating oxide layer 46 located on the source region 201;

an erasing gate 47 located on the insulating oxide layer 46; and a tunnel insulating layer 48 located between the erasing gate 47 and the floating gate 42.

The split gate memory device may be a P-type memory. In another word, ions injected to the source region 201 and the drain region 202 are N ions such as phosphorus. A read operation, a write operation and an erase operation may be performed on the split gate memory device.

In the read operation, the source region 201 and the semiconductor substrate 20 are grounded, the control gate 44 is applied with a voltage of 1.2 V, and a part B of the channel region 203 is opened. At this time, if the floating gate 42 is stored with electrons therein, part A of the channel region 203 will be closed, thus the entire channel region 203 will be closed. Accordingly, when a voltage of 0.8 V is applied to the drain region 202, the channel region 203 almost has no electrical current, it can be seen that the floating gate 42 is stored with electrons. Otherwise, if the floating gate 42 is not stored with electrons therein, part A of the channel region 203 will be opened, thus the entire channel region 203 will be opened. Accordingly, when a voltage of 0.8 V is applied to the drain region 202, the channel region 203 forms an electrical current, it can be seen that the floating gate 42 is not stored with electrons.

In the write operation, the source region 201 and the semiconductor substrate 20 are grounded, the control gate 44 is applied with a voltage of 1.1 V, and the part B of the channel region 203 is opened, the source region 201 is applied with a voltage of 9 V, and the drain region 202 is applied with a voltage of 0.5 V. Accordingly, in the channel region 203, electrons flow into the source region 201 form the drain region 202. In the flow process, some of the electrons jump into the floating gate 42 and be stored therein.

In the erase operation, the source region 201, the drain region 202 and the semiconductor substrate 20 are grounded, the erasing gate 47 is applied with a voltage of 7 V. Accordingly, a voltage difference is formed between the erasing gate 47 and the floating gate 42, and electrons in the floating gate 42 are dragged into the erasing gate 47.

In some embodiments of the present disclosure, the voltage applied to the control gate 44 in the read operation ranges from 1.0 V to 1.8 V. The voltage applied to the control gate 44 in the write operation ranges from 1.0 V to 1.8 V. The voltage applied to the erasing gate 47 in the erase operation ranges from 7 V to 9 V. It should be noted that, a threshold voltage required to open the part B of the channel region is able to be adjusted to be in accordance with a voltage of a logic transistor in a periphery circuit, via adjusting a thickness of the second gate oxide layer 43 underneath the control gate 44. Therefore, in a circuit design, the split gate memory device and a logic circuit are tend to be compatible. In addition, the threshold voltage required to open the part B of the channel region is the voltage applied to the control gate 44 in the read and write operation.

In some embodiments of the present disclosure, the threshold voltage required to open the part B of the channel region ranges from 1.0 V to 1.8 V, the thickness of the second gate oxide layer 43 underneath the control gate 44 ranges from 1 nm to 10 nm.

Voltages can be applied to the control gate 44 and the erasing gate 47 via a metal interconnection structure. Metal silicide (not shown in the drawings) may be formed on a surface of the control gate 44 and a surface of the erasing gate 47, so as to reduce a contact resistance. Voltage can be applied to the source region 201 via a conductive plug 49 contacted with the source region 201 or the metal interconnection structure connected with the conductive plug 49.

In can be understood that, in the present disclosure, the erase operation is not controlled by the control gate 44 any more, and the control gate 44 does not required to be applied with a high voltage in the read and write operation, thus in the read operation, the write operation and the erase operation of the split gate memory device, a high voltage is not required to be applied to the control gate 44. Accordingly, hot electron effect in the channel region may be avoided, thus reliability of the split gate memory device may be improved. In addition, as high voltage is not required to be applied to the control gate 44, the thickness of the gate oxide layer (specifically the second gate oxide layer 43) underneath the control gate 44 may be reduced. In some embodiments of the present disclosure, the thickness of the second gate oxide layer 43 ranges from 1 nm to 10 nm.

Based on the split gate memory device recited above, a semiconductor device and a manufacturing method thereof are also provided by one embodiment of the present disclosure.

Figure 3:
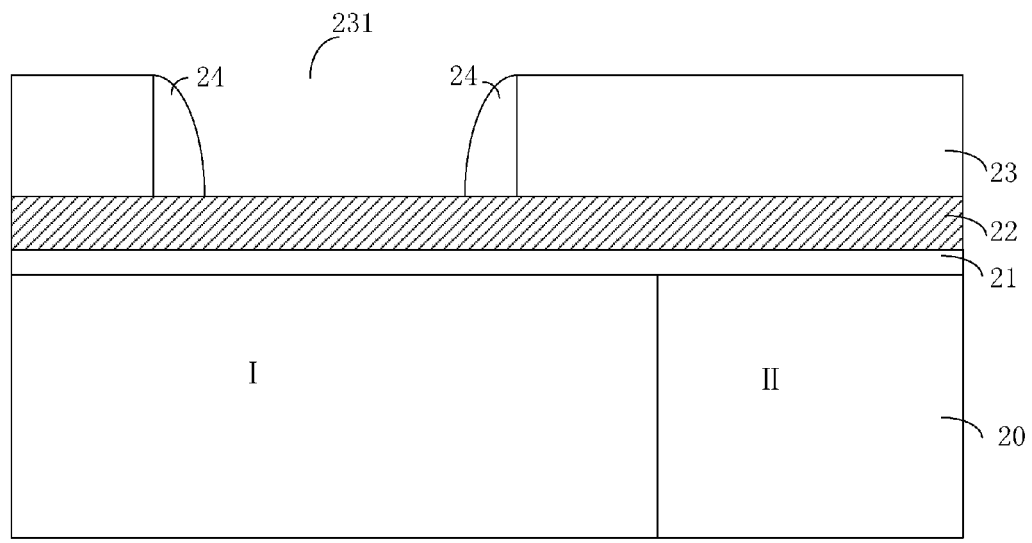
FIGS. 3-9 schematically illustrate cross-sectional structures of an semiconductor device in different phrases of an manufacturing process according to one embodiment of the present disclosure.

Specifically, referring to FIG. 3, the manufacturing method includes: providing a semiconductor substrate 20 which at least has a storage unit region I and a periphery circuit region II.

The semiconductor substrate 20 may be made of silicon, germanium or silicon on insulator (SOI). The storage unit region I is used for forming the split gate memory device, and the periphery circuit region II is used for forming a logic transistor.

Referring still to FIG. 3, the manufacturing method further includes: forming a first oxide layer 21 on the semiconductor substrate 20; forming a first polycrystalline silicon layer 22 on the first oxide layer 21; and forming a hard mask layer 23 on the first polycrystalline silicon layer 22, wherein the hard mask layer 23 has a first groove 231, the first groove 231 and a fraction of the hard mask layer 23 around the first groove 231 are located on the storage unit region I, and other fraction of the hard mask layer 23 is located on the periphery circuit region II.

Figure 8:
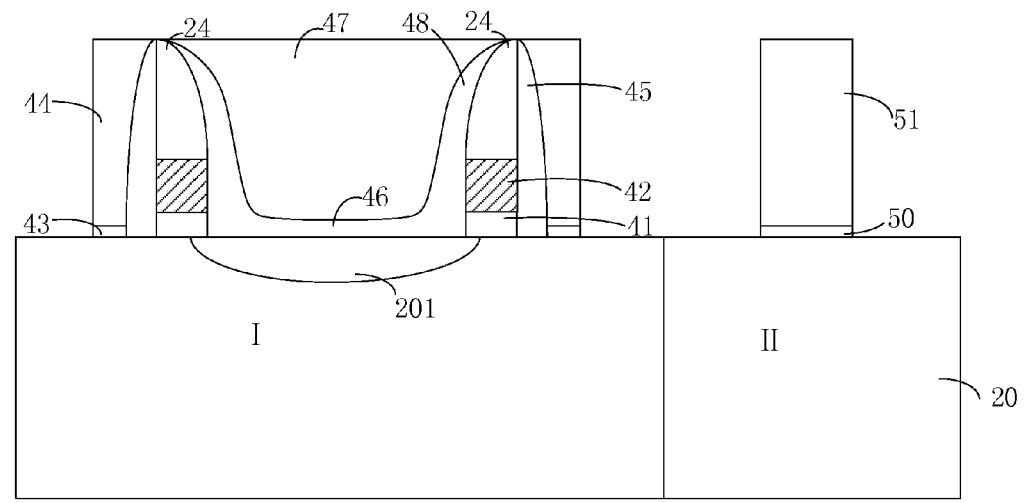

The first polycrystalline silicon layer 22 is used for forming a floating gate 42 (as shown in FIG. 8) of the split gate memory device. Accordingly, the first oxide layer 21 is used for forming a first gate oxide layer 41 (as shown in FIG. 8) which isolates the floating gate 42 from the semiconductor substrate 10. The first oxide layer 21 may be made of silicon oxide, or exited materials of gate oxide layer. The hard mask layer 23 may be made of silicon nitride, or exited materials of hard mask layer. The first groove 231 may be formed by an photolithography process and an etching process.

Figure 4:
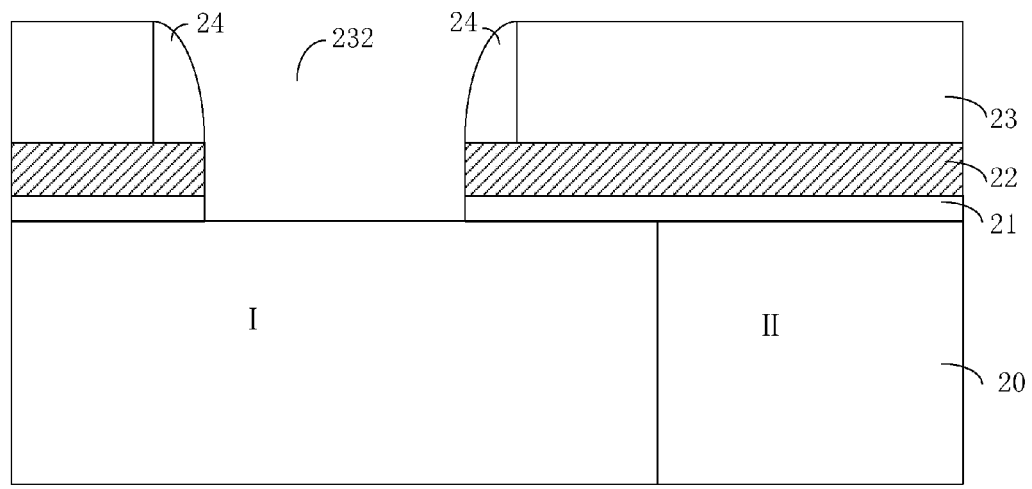

Thereafter, forming first spacers 24 on each sidewall of the first groove 231, and implementing an etching process to the first polycrystalline layer 22 and the first oxide layer 21 by taking the first spacers 24 as a mask, so as to form a second groove 232 as shown in FIG. 4.

The above recited etching process is a dry etching process which has an etching gas of $CF_4$.

The first spacers 24 may be made of silicon oxide, and the first spacers 24 may be formed by an etch back process which is also known as etching without mask.

Figure 5:
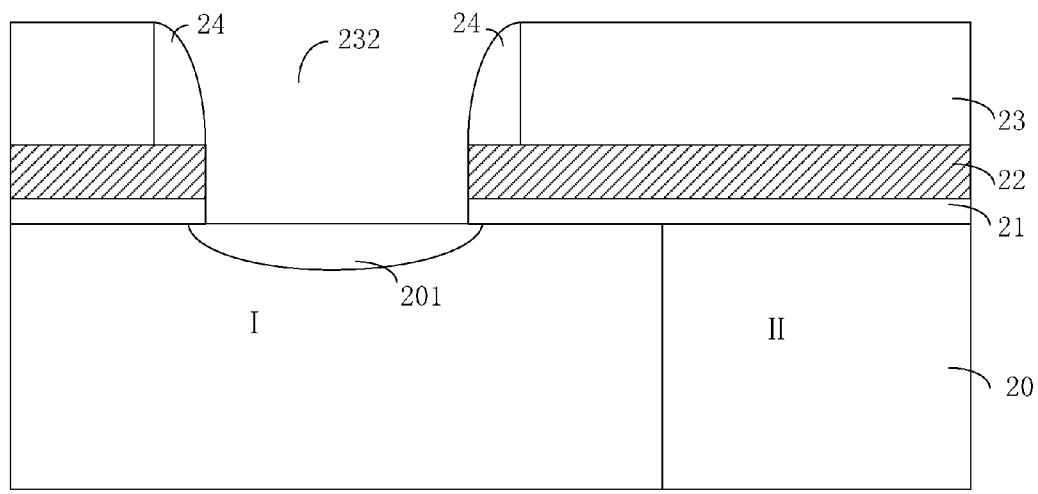

Referring to FIG. 5, the manufacturing method further includes: injecting ions into a portion of the semiconductor substrate 20 which is located underneath a bottom of the second groove 232, so as to form a source region 201 of a storage transistor.

In some embodiments of the present disclosure, as the storage transistor formed is a P storage transistor, injected ions are N ions such as phosphorus. Furthermore, an injected dosage and an injected depth may be determined by referring to injected dosages and injected depths of existed PMOS transistors.

Figure 6:
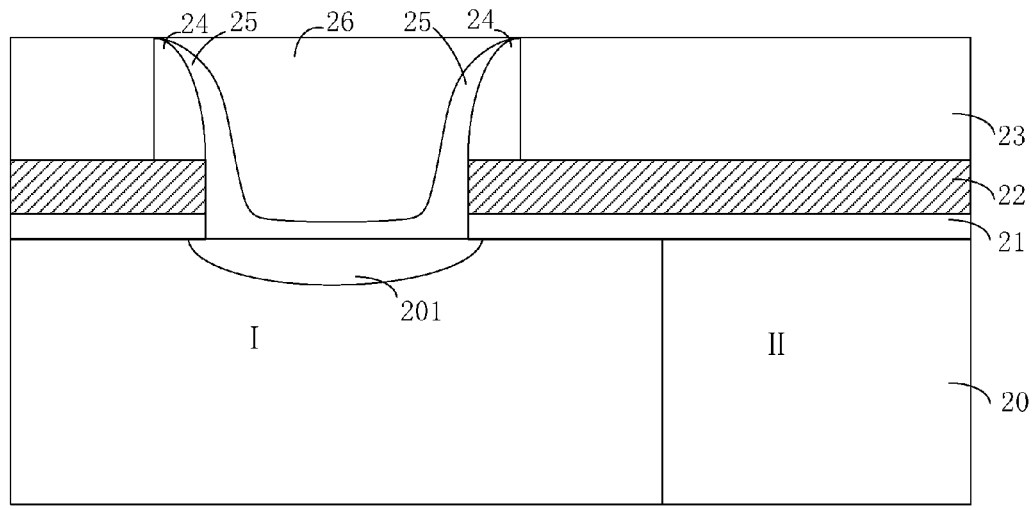
Figure 7:
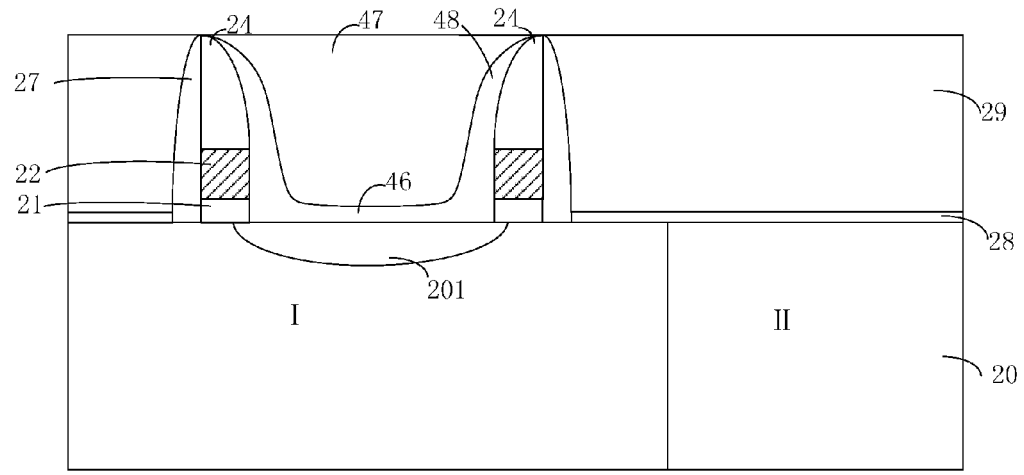

Referring to FIG. 6, the manufacturing method further includes: forming a second oxide layer 25 on the bottom and sidewalls of the second groove 232; and forming a second polycrystalline layer 26 on the second oxide layer 25 until the second groove 232 is completely filled up; wherein the second polycrystalline layer 26 in the second groove constitutes an erasing gate 47 (as shown in FIG. 7), portions of the second oxide layer 25 which are located on the sidewalls of the second groove 232 constitute tunnel insulating layers 48 (as shown in FIG. 7), a portion of the second oxide layer 25 which is located on the bottom of the groove 232 forms an insulating oxide layer 46 (as shown in FIG. 7).

In practice, the second oxide layer 25 and the second polycrystalline layer 26 are successively deposited on the hard mask layer 23 outside the second groove 232, and the sidewalls and the bottom of the second groove 232 by a physical vapor deposition (PVD) process or a chemical vapor deposition (CVD) process. The second oxide layer 25 is thinner, while the second polycrystalline layer 26 follow-up formed is thicker for completely filling up the second groove. Thereafter, implementing a chemical mechanical polishing (CMP) for removing the second oxide layer 25 and the second polycrystalline layer 26 which are formed outside the second groove 232 until a surface of the hard mask layer 23 is exposed.

Referring to FIG. 6 and FIG. 7, the manufacturing method further includes: removing, by a photolithography process and an etching process, the hard mask layer 23, and a portion of the first polycrystalline layer 22 and a portion the first oxide layer 21 which are located underneath the mask layer 23, so as to expose the first spacers 24, a sidewall formed by the first polycrystalline layer 22 and the first oxide layer 21, and a surface of the semiconductor substrate 20. Other portion of the first polycrystalline layer 22 and other portion the first oxide layer 21 which are reserved form the floating gate 42 (as shown in FIG. 8) and the first gate oxide layer 41, respectively.

Referring still to FIG. 7, a second spacer 27 is formed on the exposed sidewalls of the first spacer 24, the remained first polycrystalline silicon layer 22 and the remained first oxide layer 21.

The second spacer 27 may be formed by way of etch back, after depositing a layer of silicon nitride or a layer of silicon oxide on the erasing gate 47, the first spacer 24, the sidewall of the first polycrystalline layer 22 and the first oxide layer 21, and the surface of the semiconductor substrate which are exposed. Optionally, the layer of silicon nitride or the layer of silicon oxide is deposited by CVD. The second spacer 27 has a thickness ranging from 20 nm to 100 nm.

Referring still to FIG. 7, the manufacturing method further includes: forming a third oxide layer 28 on the exposed surface of the semiconductor substrate; forming a third polycrystalline layer 29 on the third oxide layer 28; and implementing the photolithography process and the etching process to the third oxide layer 28 and the third polycrystalline layer 29, so as to form a second gate oxide layer 43 and a control gate 44 on the storage unit region I, and form a third gate oxide layer 50 and a gate 51 of the logic transistor on the periphery circuit region II, respectively, as shown in FIG. 8.

As shown in FIG. 7 and FIG. 8, the second spacers 27 are used for forming insulating layers 45 which isolate the floating gate 42 from the control gate 44.

Figure 9:
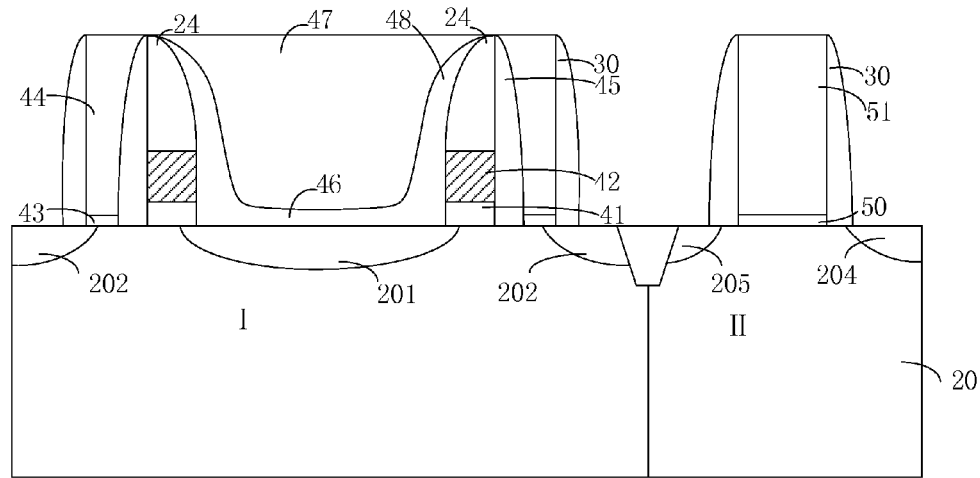

Referring to FIG. 9, the manufacturing method further includes: forming third spacers 30 on a sidewall formed by the second oxide layer 43 and the control gate 44, and on sidewalls formed by the third gate oxide layer 50 and the gate 51 of the logic transistor; and injecting ions, by taking the third spacers 30 as masks, so as to form a drain region 202 of the storage transistor, and a source region 204 and a drain region 205 of the logic transistor, respectively.

In order to form a conductive plug in the source region 201, the manufacturing method further includes: forming an interlayer dielectric layer (not shown in the drawings) in the drain region 202 of the storage transistor, and the source region 204 and the drain region 205 of the logic transistor. The interlayer dielectric layer may be also formed on part of the source region 201 of the storage transistor. And a conductive plug 49 can be formed in the interlayer dielectric layer located on part of the source region 201 of the storage transistor, for connecting the source region 201.

It can be seen that, in the manufacturing method recited above, a pair of split gate memory devices which are in mirror symmetry along the erasing gate 47 are formed.

Based on the manufacturing method, a semiconductor device is also provided according to one embodiment of the present disclosure. As shown in FIG. 9, the semiconductor device includes: a storage unit region I and a periphery circuit region II, wherein the storage unit region I includes the split gate memory device and the periphery circuit region II includes the logic transistor.

Figure 10:
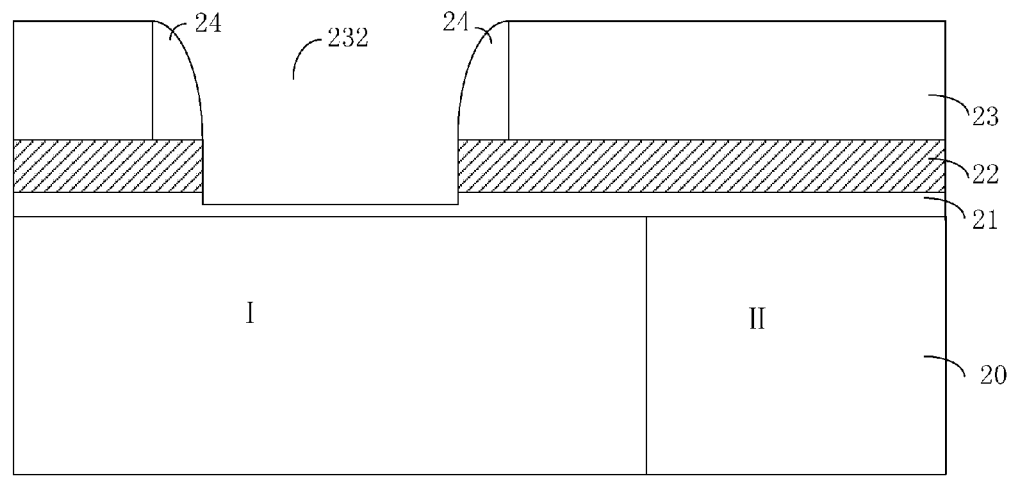
FIGS. 10 and 11 schematically illustrate cross-sectional structures of an semiconductor device in different phrases of an manufacturing process according to another embodiment of the present disclosure.
Figure 11:
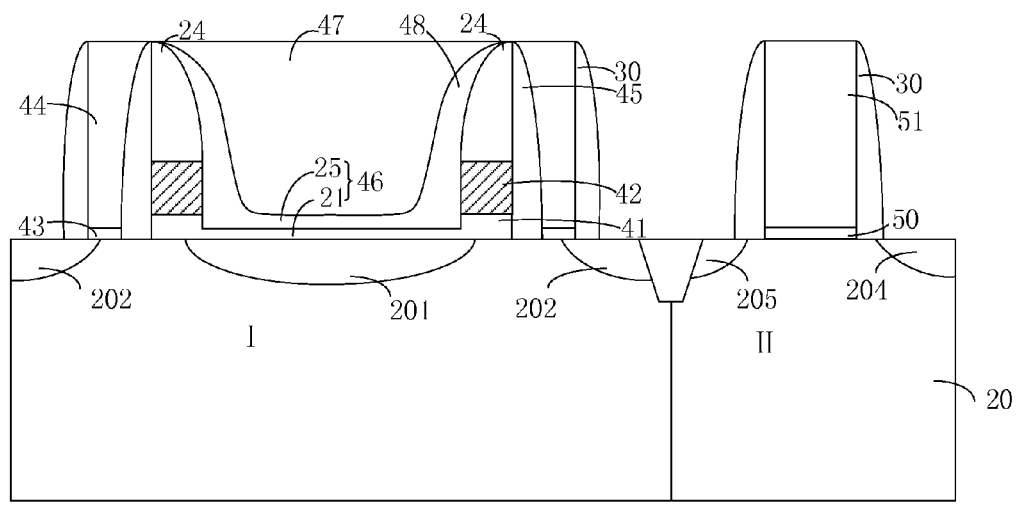

Referring to FIG. 10 and FIG. 11, a semiconductor device in different phrases of manufacturing process thereof according to one embodiment of the present disclosure is illustrated. The embodiment as shown in FIG. 10 is similar to the embodiment as shown in FIG. 4 except that: when forming the second groove 232, the first oxide layer 21 is not completely removed, that is, a thickness of the first oxide layer 21 is partially reduced. Therefore, when forming the source region 201, the reserved oxide layer 21 is able to prevent injected ions from damaging the surface of the semiconductor substrate 20. Accordingly, as shown in FIG. 11, in the semiconductor device formed, the insulating oxide layer 46 not only includes the second oxide layer 25 which is located above the bottom of the second groove 232, but also includes the first oxide layer 21 which is located on the bottom of the second groove 232.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A split gate memory device, comprising:
   a semiconductor substrate having a source region, a drain region, and a channel region located between the source region and the drain region, further comprising a conductive plug which is coupled to the source region, wherein the conductive plug is used for applying a voltage to the source region;
   a first gate oxide layer located on a first portion of the source region and a first portion of the channel region;
   a floating gate located on the first gate oxide layer;
   a second gate oxide layer located on a first portion of the drain region and a second portion of the channel region, wherein the first gate oxide layer and the second gate oxide layer are located on a same surface of the semiconductor substrate;
   a control gate located on the second gate oxide layer;
   an insulating layer isolating the first gate oxide layer and the floating gate away from the second gate oxide layer and the control gate;
   an insulating oxide layer located on the source region;
   an erasing gate located on the insulating oxide layer, wherein the floating gate is disposed between the erasing gate and the control gate on the surface of the semiconductor substrate; and
   a tunnel insulating layer located between the erasing gate and the floating gate.

2. The split gate memory device according to claim 1, further connected with another split gate memory device which has the same structure, components of the two split gate memory devices are in mirror symmetry, and two erasing gates thereof are connected.

3. The split gate memory device according to claim 1, wherein the second gate oxide layer has a thickness ranging from 1 nm to 10 nm.

4. The split gate memory device according to claim 1, wherein the insulating layer has a thickness ranging from 20 nm to 100 nm.

5. A semiconductor device, comprising: a storage unit region and a periphery circuit region, wherein the periphery circuit region comprises a logic transistor, and the storage unit region comprises a split gate memory device, the split gate memory device comprises:
   a semiconductor substrate having a source region, a drain region, and a channel region located between the source region and the drain region, further comprising a conductive plug which is coupled to the source region, the conductive plug is used for applying a voltage to the source region;
   a first gate oxide layer located on a first portion of the source region and a first portion of the channel region;
   a floating gate located on the first gate oxide layer;
   a second gate oxide layer located on a first portion of the drain region and a second portion of the channel region, wherein the first gate oxide layer and the second gate oxide layer are located on a same surface of the semiconductor substrate;
   a control gate located on the second gate oxide layer;
   an insulating layer isolating the first gate oxide layer and the floating gate away from the second gate oxide layer and the control gate;
   an insulating oxide layer located on the source region;
   an erasing gate located on the insulating oxide layer, wherein the floating gate is disposed between the erasing gate and the control gate on the surface of the semiconductor substrate; and
   a tunnel insulating layer located between the erasing gate and the floating gate.

6. The semiconductor device according to claim 5, wherein the split gate memory device is further connected with another split gate memory device which has the same structure, components of the two split gate memory devices are in mirror symmetry, and two erasing gates thereof are connected.

7. The semiconductor device according to claim 5, wherein the second gate oxide layer has a thickness ranging from 1 nm to 10 nm.

8. The semiconductor device according to claim 5, wherein the insulating layer has a thickness ranging from 20 nm to 100 nm.

9. A method for manufacturing a semiconductor device, comprising:
   providing a semiconductor substrate which at least comprises a storage unit region and a periphery circuit region;
   forming a first oxide layer on the semiconductor substrate;
   forming a first polycrystalline silicon layer on the first oxide layer;
   forming a hard mask layer on the first polycrystalline silicon layer, wherein the hard mask layer has a first groove which exposes a portion of the storage unit region;
   forming a first spacer on a sidewall of the first groove;
   etching, by using the first spacer as a mask, the first polycrystalline silicon layer and the first oxide layer until a thickness of the first oxide layer is at least partially reduced, so as to form a second groove;
   injecting ions into a portion of the substrate which is located underneath the second groove, so as to form a source region of a storage transistor;
   forming a second oxide layer on a bottom and a sidewall of the second groove;
   forming a second polycrystalline silicon layer on the second oxide layer to completely fill up the second groove, wherein the second polycrystalline silicon layer in the second groove constitutes an erasing gate, a portion of the second oxide layer which is located on the sidewall of the second groove constitutes a tunnel insulating layer, and a portion of the second oxide layer which is located between the erasing gate and the semiconductor substrate constitutes an insulation oxide layer;
   removing the remained hard mask layer, a portion of the first polycrystalline silicon layer and a portion of the first oxide layer which are disposed under the remained hard mask layer, by a photolithography process and an etching process, so as to expose sidewalls of the first spacer, the remained first polycrystalline silicon layer and the remained first oxide layer, and expose the semiconductor substrate, where the remained first polycrystalline silicon layer located under the first spacer constitutes a floating gate, and the remained first oxide layer constitutes a first gate oxide layer;
   forming a second spacer on exposed sidewalls of the first spacer, the remained first polycrystalline silicon layer and the remained first oxide layer;
   forming a third oxide layer on an exposed surface of the semiconductor substrate, and forming a third polycrystalline silicon layer on the third oxide layer;
   implementing the photolithography process and the etching process to the third oxide layer and the third polycrystalline silicon layer, so as to form a second gate oxide layer and a control gate on the storage unit region, and to form a third gate oxide layer and a gate of a logic transistor on the periphery circuit region;
   forming a third spacer on each of the exposed sidewalls of the second gate oxide layer, the control gate, the third gate oxide layer and the gate of the logic transistor, respectively; and
   injecting ions into the semiconductor substrate by using the third spacers as masks, so as to form a drain region of the storage transistor, a source region of the logic transistor, and a drain region of the logic transistor, respectively,
   forming an interlayer dielectric layer on the drain region and part of the source region of the storage transistor, and on the source region and the drain region of the logic transistor; and
   forming a conductive plug which is connected with the source region of the storage transistor, in the interlayer dielectric layer formed on part of the source region of the storage transistor,
   where the first gate oxide layer and the second gate oxide layer are located on a same surface of the semiconductor substrate, and the floating gate is disposed between the erasing gate and the control gate on the surface of the semiconductor substrate.

10. The method according to claim 9, wherein during the formation of the second groove, if the etching process is performed by using the first spacer as a mask until the first oxide layer exposed by the first spacer is completely removed and the semiconductor substrate is exposed, only the second oxide layer disposed between the erasing gate and the semiconductor substrate constitutes the insulation oxide layer, and if the etching process is performed to only reduce the thickness of the first oxide layer, the second oxide layer together with the first oxide layer remained in the etching process constitute the insulation oxide layer.

11. The method according to claim 9, wherein the second spacer is formed by a chemical vapor deposition process, and has a thickness ranging from 20 nm to 100 nm.

* * * * *